United States Patent [19]

Sato

[11] 4,340,834
[45] Jul. 20, 1982

[54] SURFACE ACOUSTIC WAVE RESONATOR DEVICE

[75] Inventor: Kouji Sato, Yokohama, Japan

[73] Assignee: Tokyo Shibaura Denki Kabushiki Kaisha, Kawasaki, Japan

[21] Appl. No.: 181,746

[22] Filed: Aug. 27, 1980

[30] Foreign Application Priority Data

Aug. 31, 1979 [JP] Japan ............................. 54-110301

[51] Int. Cl.³ ........................................... H03H 9/26
[52] U.S. Cl. .............................. 310/313 D; 310/335; 333/195
[58] Field of Search ............ 310/334, 313 D, 313 R; 333/152, 195, 197; 307/424

[56] References Cited

U.S. PATENT DOCUMENTS

| | | | |
|---|---|---|---|
| 3,444,482 | 5/1969 | Becker | 310/313 R |
| 3,862,431 | 1/1975 | Quate et al. | 307/88.3 |
| 3,952,269 | 4/1976 | Bristol | 333/152 |
| 4,166,258 | 8/1979 | Tseng | 333/195 |
| 4,204,178 | 5/1980 | Mitchell | 310/313 D |

OTHER PUBLICATIONS

Haydl, W. H., "Multimode SAW Resonators", 1976 IEEE Ultrasonic Symposium, pp. 287–291.
Shimizu, H., "Control of Waveguide Characteristics and Suppression of Spurious Transverse Modes for SAW Resonators", Japanese Acoustic Soc., p. 80, 1979.

Primary Examiner—J. D. Miller
Assistant Examiner—D. L. Rebsch
Attorney, Agent, or Firm—Schuyler, Banner, Birch, McKie & Beckett

[57] ABSTRACT

This disclosure concerns surface acoustic wave resonator devices having grating reflectors. The resonator comprises a substrate of piezoelectric material, an input interdigital transducer which converts electrical energy to surface acoustic wave energy, an output interdigital transducer which converts surface acoustic wave energy to electrical energy, first and second grating reflectors arranged in spaced aligned relationship on opposite ends of the substrate with the input transducer and the output transducer interposed therebetween the input transducer and the output transducer.

The first grating reflector, whose aperture length is the same effective length as the input and output transducers, comprises a first group of interconnected parallel spaced conductors, a second group of interconnected parallel spaced conductors and at least one of isolated parallel conductors positioned between the first and second group of conductors. Each conductor of the one group is aligned with a corresponding conductor of the first group and a corresponding conductor of the second group. Each conductor of the first and second group is parallel and electrically interconnected. The second grating reflector is identical with the first grating reflector.

14 Claims, 9 Drawing Figures

SURFACE ACOUSTIC WAVE RESONATOR DEVICE

BACKGROUND OF THE INVENTION

This invention relates to surface acoustic wave resonator devices having grating reflectors and more particularly to resonator devices used as bandpass filters and oscillator frequency control elements in the VHF or UHF frequency ranges.

There is frequently a requirement in communications and other electronic fields for filters which process a very narrow frequency range (i.e., bandpass filters or oscillator frequency control elements). Depending on the specific requirements and the frequency range under consideration, there are available various approaches in fulfilling this requirement. One approach frequently used is a crystal resonator employing a quartz crystal. It is extremely difficult, however, to construct such a filter for use in the VHF and UHF bands of the resonator because resonance frequency must be determined by the thickness of the quartz crystal.

Surface acoustic wave resonator devices having a pair of grating reflectors are generally employed as filters in such high frequency ranges. This kind of surface acoustic wave resonator devices are described, for example, in U.S. Pat. No. 3,886,504 and U.S. Pat. No. 4,166,258. In such resonators, the grating reflectors comprise a plurality of parallel conductors. The generated waves propagate in a direction perpendicular to the longitudinal orientation of the conductors but also in other directions which are not aligned with the longitudinal orientation of the conductors. Therefore, a pair of reflectors confines not only the fundamental mode but also higher transverse modes. Such higher transverse modes cause spurious responses in the attenuation characteristics of the surface acoustic wave resonator.

One method for eliminating much higher transverse modes is by apodizing input and output electrodes. This is reported by W. H. Haydl et al. in a paper entitled "Multimode Saw Resonators—a Method to Study the Optimum Resonator Design," presented at the 1976 IEEE Ultrasonics Symposium Proceeding, pages 287–291 (see FIG. 20), 1976. With such a structure, however, the effective finger number of the input and output electrodes is necessarily reduced; as a result, the equivalent coupling coefficient of the device is lowered. Therefore, this method has a disadvantage of bandwidth reduction.

Another method for suppressing the higher transverse modes requires utilizing a plurality of parallel interconnected conductors extending through a waveguide wherein the position of the conductors outside the waveguide are narrower than the portion within the waveguide. A modification of this method utilizes a plurality of parallel conductors extending through a waveguide wherein the portion of the conductors outside the waveguide are isolated (strips or lines of dot electrodes) whereas the conductors within the waveguide are solid interconnected conductors. These methods are described by Hiroshi Shimizu et al in a paper entitled "Control of Waveguide Characteristics and Suppression of Spurious Transverse Modes for SAW Resonators" (see FIG. 3 (a), (b), p. 80) presented at the Japanese Acoustic Society, June 1979. With these methods, however, appropriate electrodes are formed external to a waveguide. Therefore, in utilizing such methods, the substrate must necessarily be wider than the effective length of the input and output transducers to accommodate the external conductors. This produces the disadvantage of requiring a large resonator device.

U.S. Pat. No. 3,952,269, also discloses a surface acoustic wave device which utilizes isolated parallel conductors. The device, however, is used as a delay line which exhibits accurate time delay and insertion phase. This patent neither discloses, or suggests the use of grating reflectors to suppress higher transverse modes.

SUMMARY OF THE INVENTION

It is one object of this invention to provide a relatively small surface acoustic wave resonator device.

It is a further object of this invention to provide a surface acoustic wave resonator device which sufficiently suppresses higher transverse modes in the attenuation characteristics. It is yet a further object of this invention to provide a surface acoustic wave resonator device having small insertion loss in the attenuation characteristics. According to this invention, the foregoing and other objects are attained by providing a surface acoustic wave (hereinafter SAW) resonator device comprising: a substrate having at least a surface layer of piezoelectric material, at least one interdigital transducer means having an effective length and disposed on the piezoelectric surface for converting an input electrical signal to surface acoustic waves propagating on the piezoelectric surface of the substrate, grating reflector means having an aperture length and disposed on the piezoelectric surface for reflecting the surface acoustic waves, and the aperture length of the grating reflector means having substantially the same effective length as the interdigital transducer means. The grating reflector means comprising: a first group of interconnected parallel spaced conductors, a second group of interconnected parallel spaced conductors, each conductor of the second group being aligned with a corresponding conductor of the first group, at least one group of isolated parallel conductors positioned between the first and second group of conductors, each conductor of the one group being aligned with a corresponding conductor of the first group and a corresponding conductor of the second group.

BRIEF DESCRIPTION OF THE DRAWINGS

Other objects and features of this invention will become apparent to those skilled in the art as the disclosure is made in the following description of a preferred embodiment of the invention, as illustrated in the accompanying sheet of drawings.

DESCRIPTION OF THE PREFERRED EMBODIMENTS

Figure 1:
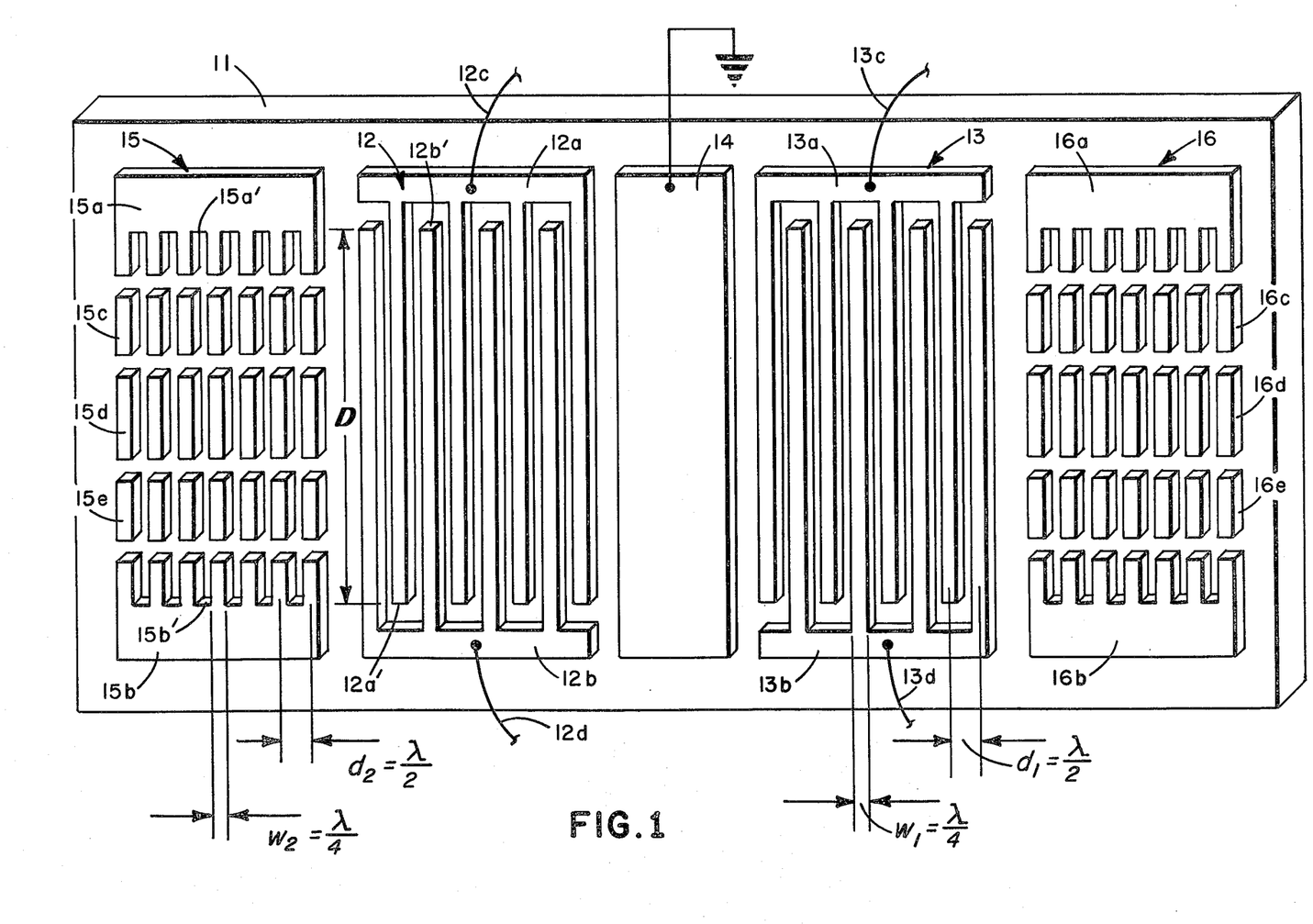
FIG. 1 shows a plan view of one embodiment of the two-port type SAW resonator in accordance with the present invention, in which two grating reflectors are positioned at opposite ends of the resonator's substrate.

FIG. 1 shows one embodiment of the invention utilized in a two-port SAW resonator device. The resonator device comprises a substrate 11 of piezoelectric material such as lithium niobate or quartz. Positioned on substrate 11 are an input interdigital transducer 12 and an output interdigital transducer 13. These transducers are positioned in a face to face relationship with a shield electrode 14 positioned therebetween. Shield electrode 14 is formed in order to decrease electromagnetic feed through between the input IDT 12 and the output IDT 13. The input interdigital transducer (hereinafter IDT) 12 comprises a first electrode 12a and a second electrode 12b. These electrodes have many fingers which are arranged in a interdigitated relationship. Namely, the input IDT 12 has a solid type interdigital structure. That is, only one figure of a first (or second 12b) electrode 12a is positioned between the fingers of a second (or first 12a) electrode 12b (see FIG. 1). The electrodes 12a, 12b may be formed of a suitable patterned thin film electrically conductive material such as, gold, copper, aluminum.

Electrodes 12a and 12b are illustrated in FIG. 1 as each having four fingers, although it should be understood that the electrodes may have a larger number of fingers. Each finger has a width $w_1$ in which equals $\lambda/4$ and the spacing between adjacent fingers is equal to $\lambda$, where $\lambda$ is a wave length of the generated surface acoustic wave. Accordingly, the spacing $d_1$ between adjacent fingers becomes $\lambda/2$.

The output interdigital transducer (i.e., IDT 13) comprises electrodes 13a and 13b having electrodes formed in a manner similar to those of input IDT 12. On opposite ends of substrate 11 are a pair of grating reflectors 15 and 16. Grating reflector 15 comprises a first group of interconnected parallel spaced conductors 15a and a second group of interconnected parallel spaced conductors 15b. Each conductor of said second group 15b is aligned with a corresponding conductor of said group 15a. This first and second group of conductors form the outer ends of the grating reflector. Reflector 15 also comprises at least one group of isolated parallel conductors positioned between the first and second group of conductors 15a and 15b. As shown in FIG. 1, a first, second, and third group of isolated parallel conductors 15c, 15d, 15e, respectively are positioned between the first and second group of conductors 15a, 15b. The conductors 15a–15e may be formed of an electrically conductive material such as gold, copper, aluminum. The width $w_2$ of the parallel conductors is $\lambda/4$ and the spacing $d_2$ between adjacent conductors is $\lambda/2$. The inner edges 15a', 15b' of the outer ends of the first and second groups of interconnected parallel spaced conductors 15a, 15b are substantially aligned with the respective free ends 12a', 12b' of electrodes 12a, 12b of input IDT 12. Namely, the grating reflector 15 has an aperture length D as waveguide, wherein the aperture length D is substantially equal to the effective length of the input IDT 12 (i.e., the distance between the free ends 12a', 12b' of electrodes 12a, 12b.

As shown in FIG. 1, the two groups of interconnected parallel spaced conductors 15a and 15b have their conductors interconnected along a common end. In particular, the outer ends of each group of conductors are interconnected. Each of the first, second and third groups of isolated parallel conductors 15c, 15d, 15e has its isolated conductors spaced in the direction of the length of substrate 11. Each conductors of group 15c, 15d, 15e is aligned with a corresponding conductor of first group 15a and a corresponding conductor of second group 15b. Each group of interconnected parallel spaced conductors 15a and 15b and each group of isolated parallel conductors 15c, 15d, 15e are illustrated in FIG. 1 as having seven parallel conductors. It should be understood, however, that each group may have a larger number of parallel conductors. The grating reflector 16 placed on the other side of substrate 11 adjacent output IDT 13 has the same structural shape and dimension as grating reflector 15. As shown in FIG. 1, it comprises a first and second group of interconnected parallel spaced conductors 16a, 16b and a first, second, and third group of isolated parallel conductors 16c, 16d, 16e. Grating reflectors 15 and 16 can be formed by cutting metal film formed on substrate 11 in the desired configuration.

In operation the SAW resonator device is connected as follows. Shield electrode 14 is grounded as illustrated in FIG. 1, while input IDT 12 is coupled by means of wires 12c and 12d to an input electrical excitation source (now shown). As a result, the input IDT 12 generates SAWs whose frequency is determined by the spacing between adjacent fingers in accordance with the input electrical signal. The SAWs propagate in the both directions along the substrate and contact grating reflector 15 and shield electrode 14. The SAWs propagating in the direction of the grating reflector 15 are thereby reflected as is well known (see U.S. Pat. No. 3,886,504). The width $w_2$ of its conductors are $\lambda/4$ and the spacing $d_2$ between adjacent conductors is $\lambda/2$; consequently, two SAWs which are reflected by one conductor and an adjacent conductor of a grating reflector are 360 degrees out-of-phase. Namely, the two SAWs reflected by both conductors strips are in phase and the reflected waves are thereby intensified. The SAWs propagating in the direction of the shield electrode 14 and the SAWs reflected by the grating reflector 15 are picked up by output IDT 13. Output IDT 13 is coupled to an external road not shown by means of wires 13c and 13d. The SAWs which pass the output IDT 13 are reflected by the grating reflector 16.

This embodiment of the invention differs from SAW resonators known in the prior art by utilizing grating reflectors 15 and 16 divided in the direction of length of the substrate 11. Namely, for example, the grating reflector 15 comprises two groups of interconnected parallel spaced conductors 15a, 15b and three groups of isolated parallel conductors 15c, 15d, 15e. The suppression of higher transverse mode waves occurs by the manner in which grating reflectors 15, 16 affect the propagation velocity of the SAWs. In understanding this suppression characteristic, three separate areas should be considered: the area formed by the three groups of isolated parallel conductors 15c, 15d, 15e; the area formed by the two groups of isolated parallel conductors 15a and 15b; and the area adjacent the reflector which doesn't contain any of its conductors.

The propagation velocity of the area adjacent the reflector is fastest. The propagation velocity of the area by the groups of isolated parallel conductors 15c, 15d, and 15e is slowest and the propagation velocity of the area formed by interconnected parallel spaced conductors is intermediate the velocity of the other two areas. In general, along a boundary between two regions which have different propagation velocities, the SAW striking the boundary will be reflected. If the angle of incidence with the boundary line is approximately 90 degrees, the SAW will entirely pass through the boundary without any reflections. The angle at which the waves are entirely reflected without a portion passing through is called the critical angle. An angle of incidence in excess of the critical angle produces the total reflection. When waves move from a low velocity region into a high velocity region, without the presence of an intermediate velocity region the critical angle is large. As a result, a large amount of reflection will exist for various angles of incidence of the SAWs. For example, if the area formed by interconnected parallel spaced conductors 15a and 15b is not present the higher transverse modes which strike the boundary at various angles will be substantially reflected and, thus, a large number of higher transverse modes, will exist in grating reflector 15. However, if the area formed by the interconnected conductors are present it will act as a buffer region. Namely, two boundaries will exist and the critical angles at both boundaries will be smaller than if the interconnected conductors were not present. As a result, the amount of reflections for various angles will be smaller. Therefore, the SAWs which strike the boundaries at angle substantially parallel will be reflected. Virtually all other waves striking the boundary at other angles (i.e., transverse modes) will not be reflected. Likewise, in grating reflector 16, the same phenomenon occurs. Consequently, the higher transverse modes will not appear in the output signal. As stated above, the invention utilizes a grating reflector comprising a first and second group of interconnected parallel spaced conductors and at least one group of isolated parallel conductors, wherein the aperture length of the grating reflector is substantially the same as the effective length of the interdigital transducer. Consequently, a SAW resonator device is obtained which has a small size and contains no spurious characteristics.

Figure 2:
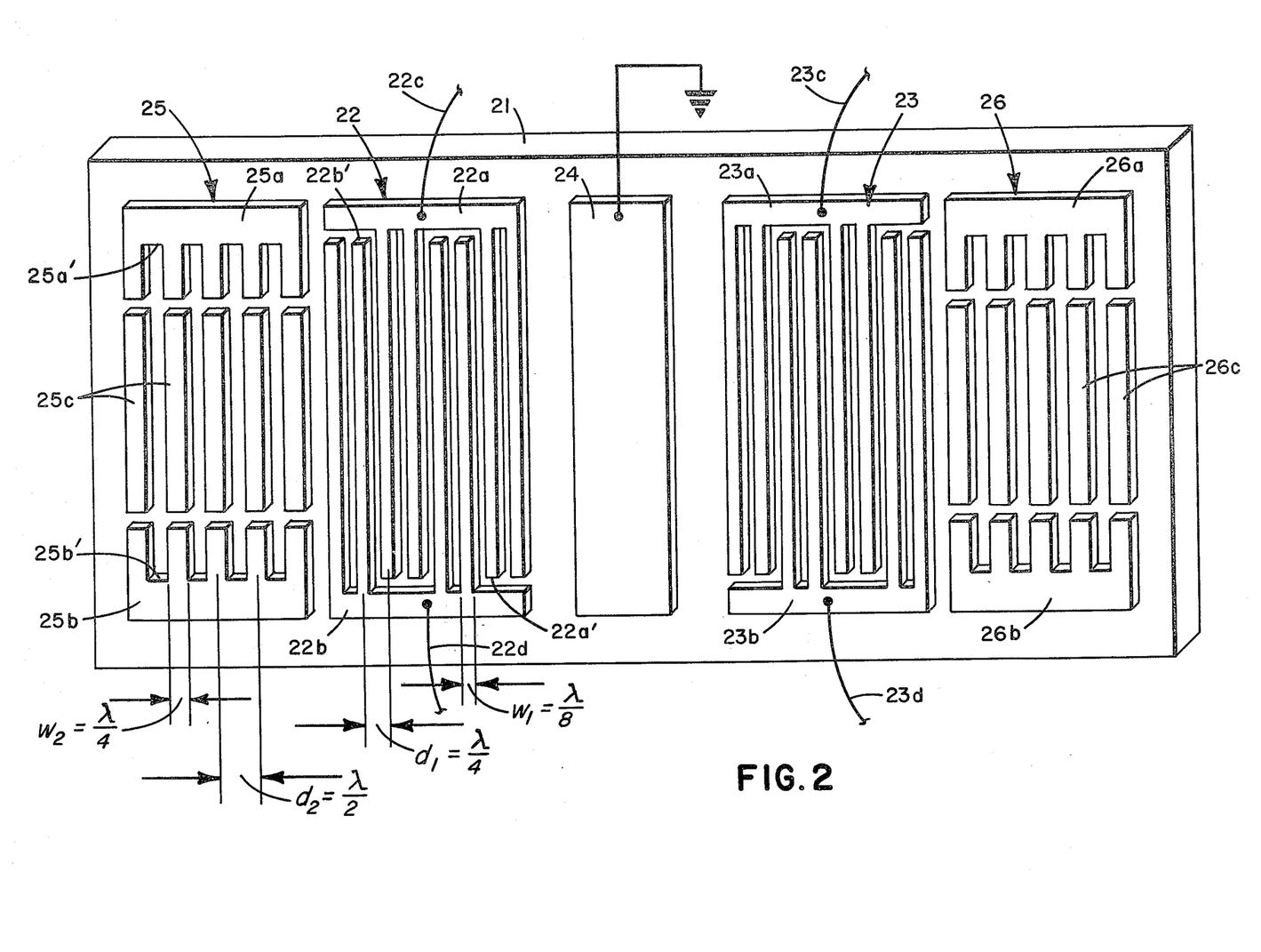
FIG. 2 shows a plan view of another embodiment of the aforesaid SAW resonator device in accordance with the present invention.

In the embodiment of this invention which has been illustrated in FIG. 1, the groups of isolated parallel conductors between the two groups of interconnected parallel spaced conductors are divided into three groups; it should be understood, however, the isolated parallel conductors may be divided into more groups or a single group can be used (e.g., FIG. 2). Moreover, in the embodiment of FIG. 1, the input and output IDT have solid type interdigital structures; however, it should be clear that the IDT may have a split type interdigital structure. For example, in the embodiment of the invention in FIG. 2, a grating reflector has a single group of isolated parallel conductors and the input and output IDT have interdigital structure of a split type. The reference numerals 21-26 used in FIG. 2 correspond to aforesaid reference numerals 11-16 used in FIG. 1. The spacing $d_1$ between adjacent fingers of the interdigitated electrodes 22a, 22b and 23a, 23b is $\lambda/4$ and the width $w_1$ of each finger is $\lambda/8$.

A grating reflector of this embodiment comprises first and second groups of interconnected parallel spaced conductors 25a and 25b which form the outer ends of the grating reflector. The inner edges 25a', 25b' of the outer end of the first and second groups of interconnected parallel spaced conductors 25a, 25b are substantially aligned with the respective free ends 22a', 22b' of electrodes 22a, 22b of input IDT 22. A group of isolated parallel conductors 25c is formed between the groups of interconnected parallel spaced conductors 25a and 25b. The groups of interconnected parallel spaced conductors 25a and 25b have their conductors interconnected along a common end. In particular, the outer ends of each group of conductors are interconnected. The group of isolated parallel conductors 25c has its isolated conductors, spaced in the direction of the length of the substrate 21. The width $w_2$ of these parallel conductors is $\lambda/4$ and the spacing $d_2$ between adjacent conductors is $\lambda/2$. The grating reflector 26 placed on the other side of substrate 21 adjacent output IDT 23 has the same structural shape and dimensions as grating reflector 15. As shown in FIG. 2, it comprises a first and second groups of interconnected parallel spaced conductors 26a and 26b, and one group of isolated parallel conductors 26c.

In an embodiment of FIG. 2, input IDT 22 is coupled by means of wires 22c and 22d to an input electrical excitation source (not shown) by means of wires 23c and 23d, while shield electrode 24 is grounded. By the embodiment shown in FIG. 2, isolated parallel conductors 25c, 26c constitute a single group. This prevents an escape of the fundamental waves which results from having several groups of isolated conductors (see FIG. 1); the area between isolated conductors causes such escape. Thus, the use of a single group of isolated conductors produces low loss such that a SAW resonator device is obtained having higher Q than the device shown in FIG. 1. Furthermore, the embodiment of FIG. 2 utilizes split type transducers so that a reduction in transducer reflection is produced to stabilize the mode of the reasonator device.

Figure 3:
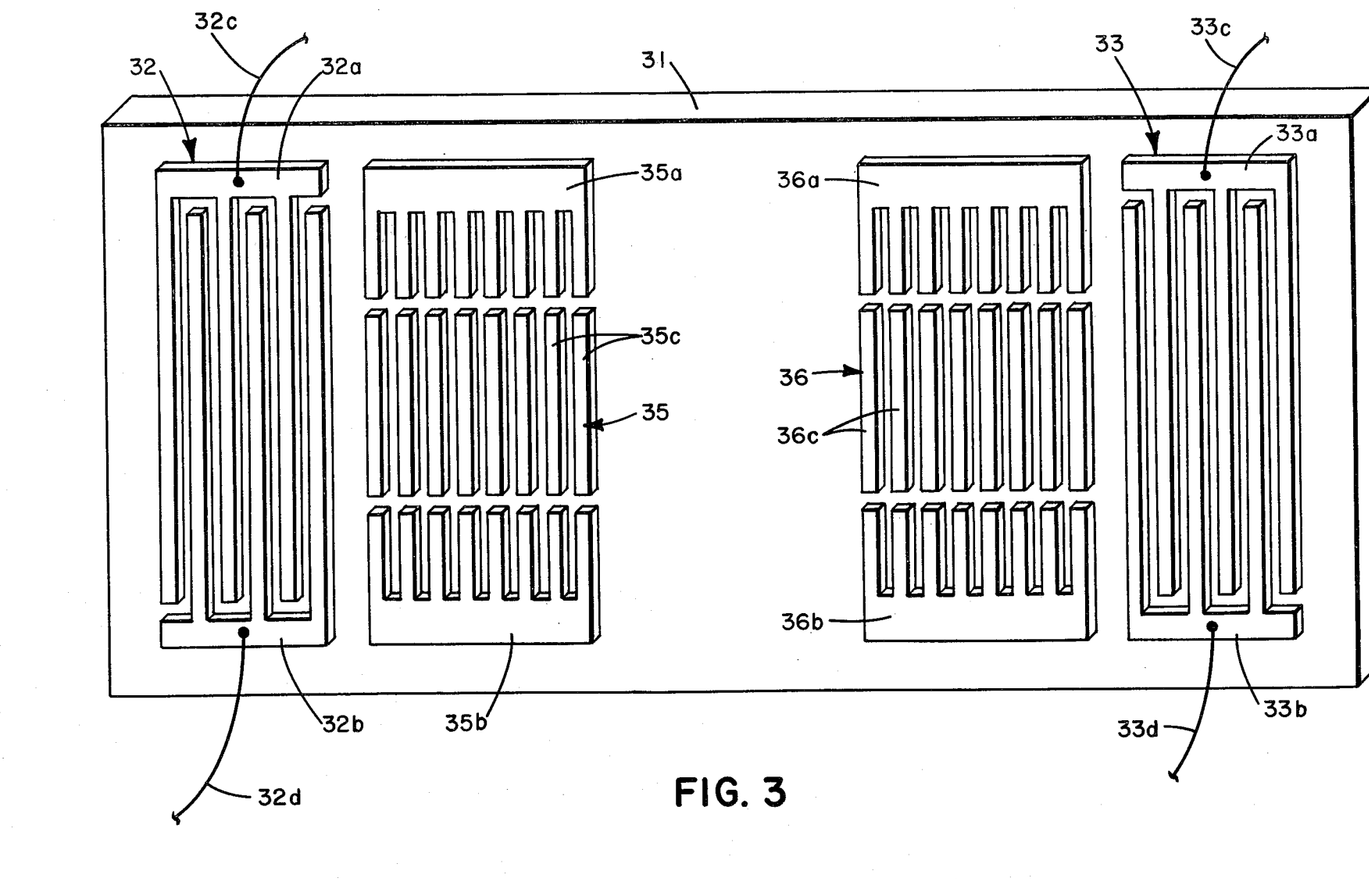
FIG. 3 is a plan view of one embodiment of the two-port type SAW resonator device in accordance with the present invention, in which grating reflectors are interposed between input and output transducers.

FIG. 3 is another embodiment of this invention which utilizes grating reflectors positioned between the input transducer and the output transducer. The reference numerals 31-36 used in FIG. 3 correspond to aforesaid reference numerals 11-16 used in FIG. 1. The finger width $w_1$ of electrodes, the spacing $d_1$ between adjacent fingers, the width $w_2$ of the conductors and the spacing $d_2$ of adjacent conductors and the same as in FIG. 1. The difference between the embodiment shown FIG. 3 and the embodiment shown FIG. 1 is the relative positioning of the input and output transducers, the lack of a shield electrode and a single group of isolated conductors. Because input and output IDTs are positioned outside of the path between grating reflectors 35 and 36, they are not part of the resonant circuit which is defined by the reflectors 35, 36. As a result, the resonator of FIG. 3 can achieve a higher Q than can be obtained with the embodiment shown in FIG. 1.

Figure 4A:
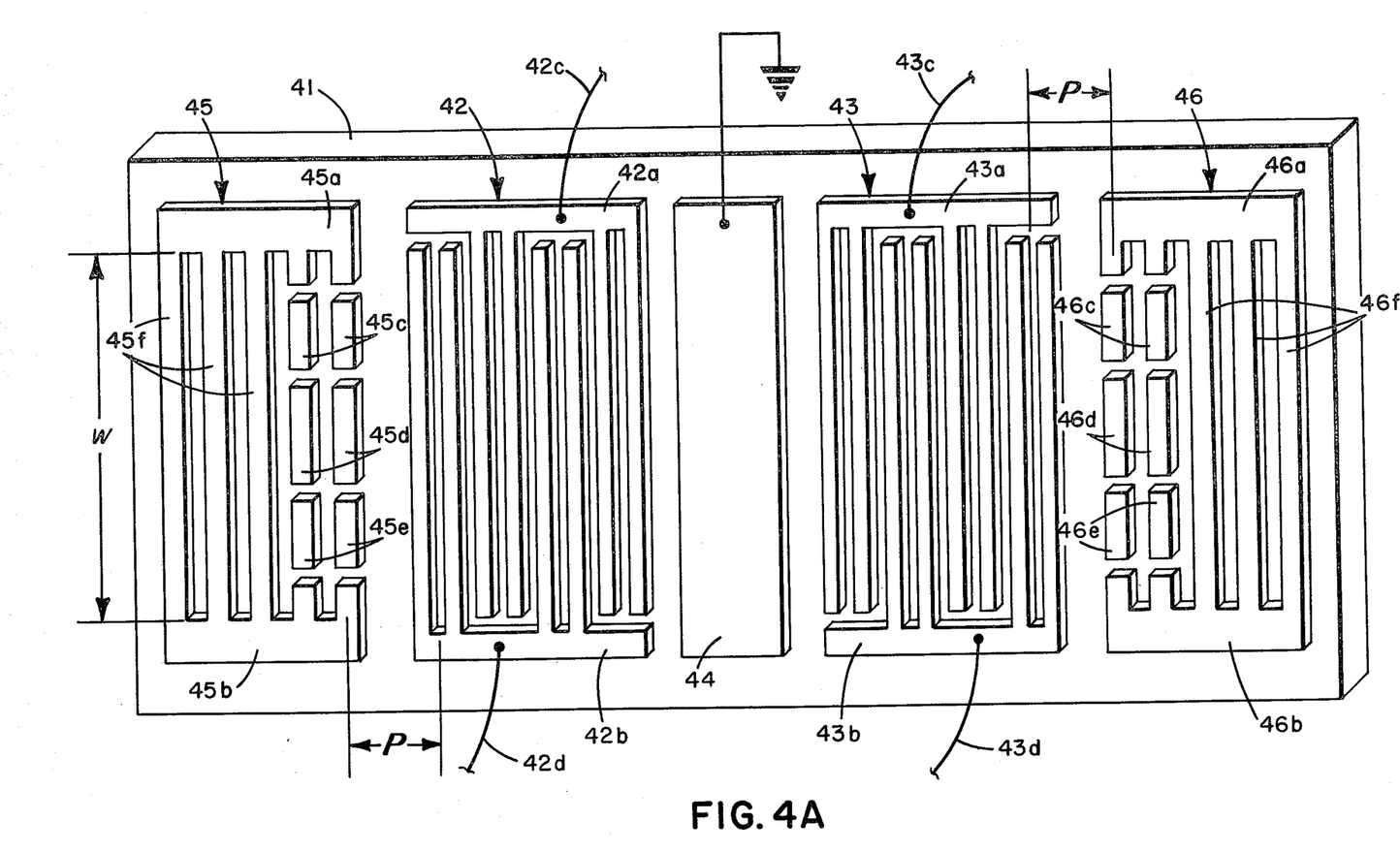
FIG. 4A is a plan view of still another embodiment of the two-port type SAW resonator in accordance with the present invention, in which two modified grating reflectors are placed at opposite ends of the resonator's substrate.

FIG. 4A is a further embodiment of the invention in which the first and second groups of interconnected parallel spaced conductors 45a, 45b are aligned with corresponding conductors of the groups of isolated parallel conductors 45c, 45d, 45e. In addition, each grating reflector has a third group of parallel spaced conductors 45f which are parallel and interconnected to the first and second group of interconnected conductors. In this embodiment, split type transducers are used as shown in FIG. 2. In FIG. 4, the reference numerals 41-46 correspond to the reference numerals 21-26 of FIG. 2.

The grating reflector 46 of FIG. 4A likewise has a third group of interconnected parallel spaced conductors 46f. Grating reflector 46 comprises a first, second, and third group, respectively, of interconnected parallel spaced conductors 46a, 46b, 46f, and a first, second, and third group, respectively, of isolated parallel conductors 46c, 46d, and 46e. In the embodiment shown in FIG. 4A as is the case of the embodiment shown in FIG. 2, the width $w_1$ (not shown) of each finger electrodes 42a, 42b, 43a and 43b is $\lambda/8$ and the spacing $d_1$ (not shown) between adjacent interdigitated fingers in $\lambda/4$. Likewise, as in FIG. 2, the width $w_2$ (now shown) of the conductors of grating reflectors 45, 46 is $\lambda/4$ and the spacing $d_2$ (now shown) between conductors is $\lambda/2$.

The energy of the SAWs passing through the isolated conductors will be reflected by the conductors of the third group 45f and 46f. This arrangement produces lower energy loss than the embodiment shown in FIGS. 1-3. In FIG. 4A, the first and second group of interconnected conductors and each isolated group of conductors has two conductors, and the third group of interconnected conductors has three conductors, it should be clear that a larger number of conductors may be used.

Figure 4B:
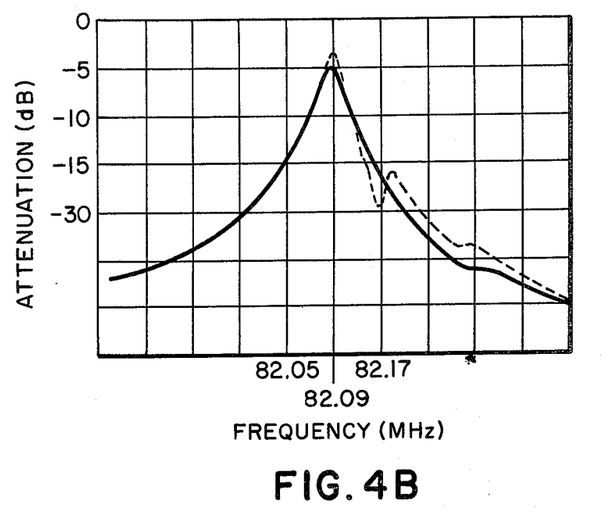
FIG. 4B is a graphical illustration of the attenuation versus frequency characteristics of the device illustrated in FIG. 4A.

FIG. 4B shows the practical attenuation characteristics for the SAW resonator shown in FIG. 4A. These characteristics were obtained for a SAW resonator using a piezoelectric substrate 41 made of lithium tantalate (LiTaO$_3$) and having a SAW propagating direction of 112° for the Y-axis of the substrate. The input IDT 42 and the output IDT 43 had a split type configuration and each having 10.5 fingers were made of aluminum. Each of the first and second group of interconnected conductors contained 21 connectors, while a third group contained 179 conductors. Each group of the isolated conductors contained 21 conductors. The distance P between the grating reflector 45 and IDT 42, and the distance between the grating reflector 46 and output IDT 43 was each equal to 0.875$\lambda$. The effective length of input and output IDT and aperture length D of grating reflector was each equal to 1.0 mm. The thickness of the metal films of input and output IDT and grating reflectors were each equal to 1.0 $\mu$m. The center frequency of resonance was 82 MHz.

The solid line in FIG. 4B designates the attenuation characteristics of the FIG. 4A under such conditions wherein frequency (MHz) is designated on the X-axis and attenuation (dB) is designated on the Y-axis. The dotted line designates the characteristics of a prior art SAW resonator having the same dimensions as the grating reflector in FIG. 4A. The characteristics of the prior art SAW resonator include small peaks occuring frequencies higher than the resonance frequency (82.09 MHz) and produced by the higher transverse modes. For example, a peak occurs at about 82.13 MHz which is caused by the first dimension transverse mode. On the other hand, the SAW resonator of this invention precludes the occurance of higher transverse modes; consequently, there is substantially no additional peaks as clearly illustrated from the solid line of FIG. 4B. The attenuation hardly increases in the SAW resonator device shown in FIG. 4A as clear in comparison with the attenuation of solid line and dotted line at 82.09 MHz. As mentioned above regarding the embodiment of FIG. 4A, a resonance filter is obtained which has low loss, no spurious radiation and broad band characteristics.

Figure 4C:
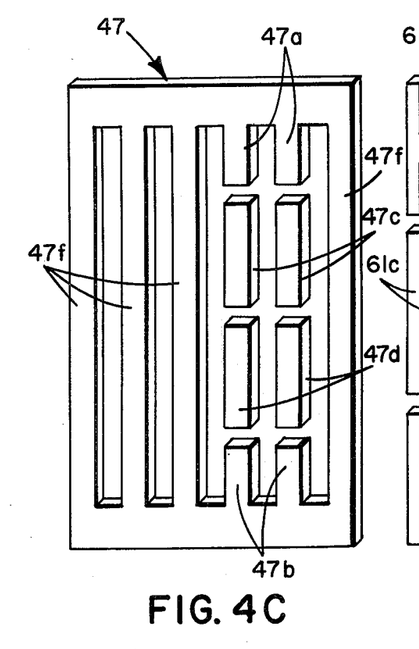
FIG. 4C shows a modification of the grating reflector illustrated in FIG. 4A.

The grating reflectors 45 and 46 of FIG. 4A have a third group of conductors adjacent to the first and the second groups of interconnected conductors. But as shown in FIG. 4C, the third group may be formed of splited interconnected conductors. Grating reflector 47 comprises a first group of interconnected parallel spaced conductors 47a, a second group of interconnected parallel spaced conductors 47b, a first group of isolated parallel conductors 47c, a second group of isolated parallel conductors 47d, and a third group of interconnected parallel spaced conductors 47f. As shown in FIG. 4C, the one inside conductor and three outside conductors are connected.

Figure 5:
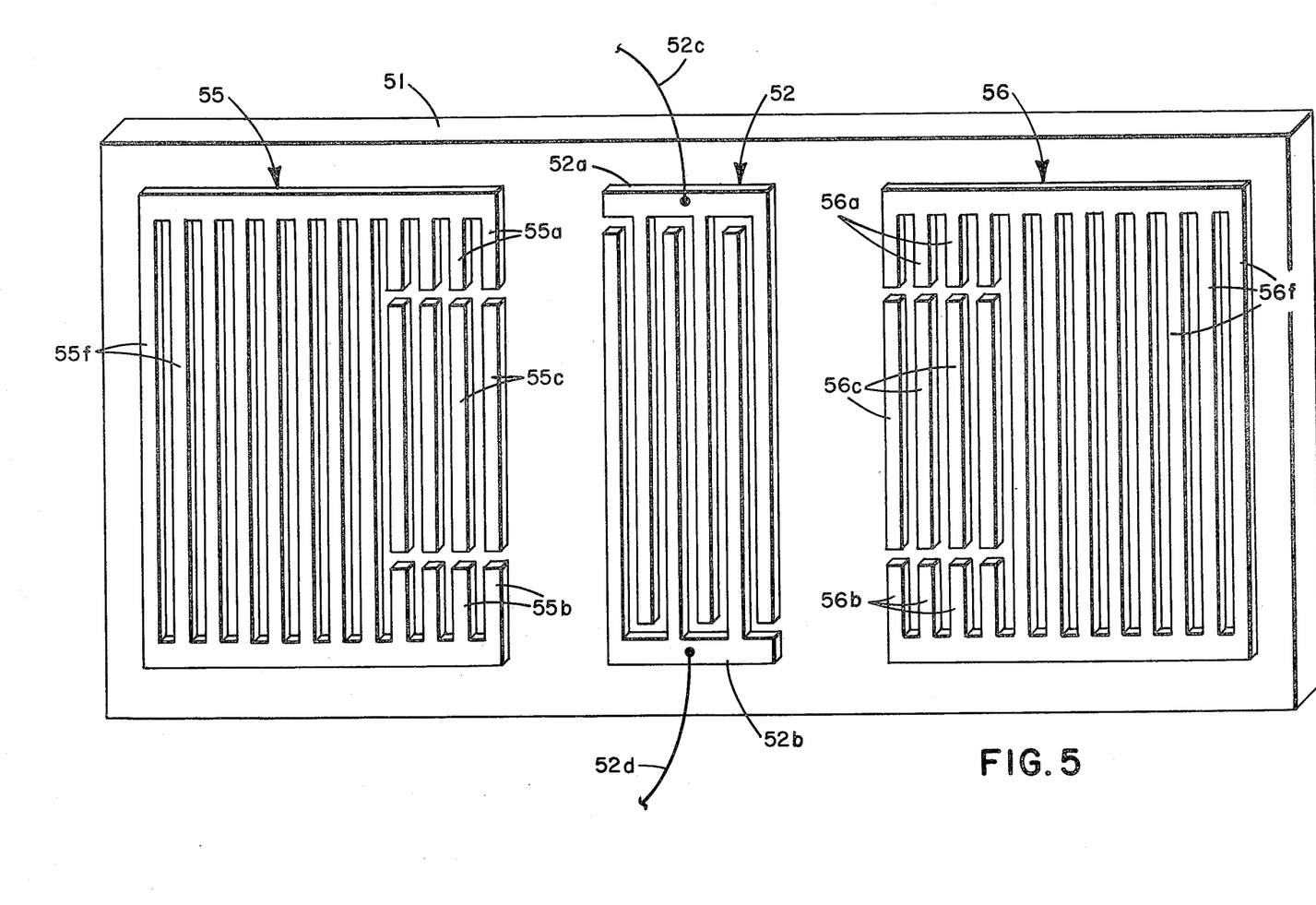
FIG. 5 shows a plan view of one embodiment of a one-port type SAW resonator in accordance with the present invention.

The above mentioned embodiments are directed to two-port resonators; however, this invention may be applied to of a one-port type. For example, FIG. 5 shows a resonator wherein an IDT 52 is utilized for both the input and output signals. IDT 52 is positioned at the middle of a substrate 51 and grating reflectors 55 and 56 are positioned at opposite ends of substrate 51. The grating reflectors 55 and 56 each has a third group of interconnected parallel spaced conductors 55f, 56f as disclosed in the embodiments of FIG. 4A. The grating reflector 55 comprises three groups of interconnected parallel spaced conductors 55a, 55b and 55f, and one group of isolated parallel conductors 55c. Likewise, the grating reflector 56 comprises three groups of interconnected parallel spaced conductors 56a, 56b, and 56f, and one group of isolated parallel conductors 56c.

Figure 6A:
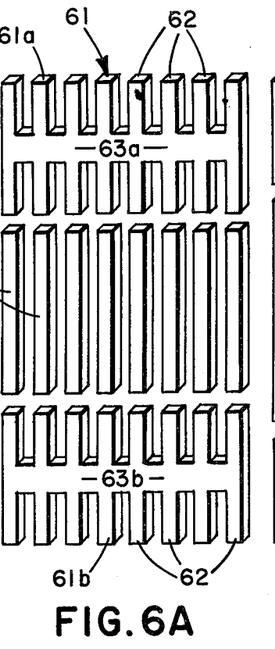
FIG. 6A shows a plan view of further modifications of the grating reflector illustrated in the foresaid figures; and, FIG. 6B shows a plan view of still another modification of the grating reflectors illustrated in the foresaid figures.
Figure 6B:
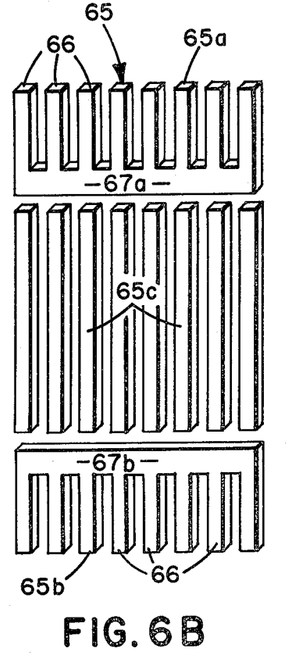

In this SAW resonator device, signals are provided into and picked up from the resonator by wires 52c and 52d connected to electrodes 52a and 52b, respectively. As in FIG. 4A, the third group of conductors of grating reflectors 55 and 56 produce lower energy loss than the embodiments of FIG. 1-3. Furthermore, a single group of isolated parallel conductors 55c, 56c is utilized and positioned between the first and second groups of interconnected parallel spaced conductors 55a, 55b and 56a, 56b; same as FIG. 4A so that a higher Q is obtained. In the above mentioned embodiments, the first and second groups of interconnected parallel spaced conductors are interconnected at the outermost position of their common end. These conductors, however, may be interconnected along a midpoint of each conductor or at the innermost portion of their common end. Namely, in FIG. 6A, grating reflector 61 comprises two groups of interconnected parallel spaced conductors 61a and 61b, and one group of isolated parallel conductor 61c. Each group of interconnected parallel spaced conductors comprises conductors 62 connected at the midpoint by a cross conductor 63a, 63b. In FIG. 6B, grating reflector 65 comprises two groups of interconnected conductors 65a and 65b, and one group of isolated parallel conductors 65c. Each group of interconnected conductors comprises conductors 66 connected at the innermost portion of their common end by a cross conductor 67a, 67b.

In the above embodiments, substrates made of piezoelectric material can be used; in addition, substrates covered with piezoelectric film can also be used.

I claim:

1. A surface acoustic wave resonator device comprising:

a substrate having at least a surface layer of piezoelectric material;

at least one interdigital transducer means having an effective length and disposed on the piezoelectric surface for converting an input electrical signal to surface acoustic waves which propagate on the piezoelectric surface of the substrate;

a pair of spaced grating reflector means, each having an aperture length and disposed on the piezoelectric surface for reflecting the surface acoustic waves, the aperture length of each grating reflector means having substantially the same effective length as the interdigital transducer means; and at least one of said grating reflector means including means for suppressing higher transverse modes, said suppressing means comprising a first group of interconnected parallel spaced conductors, a second group of interconnected parallel spaced conductors, each conductor of said second group being aligned with a corresponding conductor of said first group, and at least one group of isolated parallel conductors positioned between said first and second groups of conductors, each conductor of said one group being aligned with a corresponding conductor of said first group and a corresponding conductor of said second group.

2. A resonator device as set forth in claim 1, wherein said grating reflector further comprises a third group of interconnected parallel spaced conductors each conductor of said third group being parallel and interconnected to the conductors of said first and second groups.

3. A resonator device as set forth in claim 1, wherein the conductors of said first group are interconnected along a common end of each conductor of said first group.

4. A resonator device as set forth in claim 3, wherein the conductors of said second group are interconnected along a common end of each conductor of said second group.

5. A resonator device as set forth in claim 1, wherein the conductors of said first group are interconnected along a midpoint of each conductor of said first group.

6. A resonator device as set forth in claim 5, wherein the conductors of the second group are interconnected along a midpoint of each conductor of said second group.

7. A resonator device as set forth in claim 2, wherein the conductors of said one group are positioned on the substrate to face said interdigital transducer.

8. A surface acoustic wave resonator device comprising:

a piezoelectric substrate;

a shield electrode disposed on said piezoelectric substrate;

an input interdigital transducer having an effective length disposed on said piezoelectric substrate at one side of the shield electrode;

an output interdigital transducer having the same effective length as the input interdigital transducer and disposed on the piezoelectric substrate at the other side of the shield electrode;

a first grating reflector having an aperture length and disposed on the piezoelectric substrate at one end of the substrate;

a second grating reflector having the same aperture length as the first grating reflector and disposed on the piezoelectric substrate at the other end of the substrate, said aperture length of the first and second grating reflectors having substantially the same effective length as the input and output interdigital transducers;

said first and second grating reflectors each including means for suppressing higher transverse modes, said suppressing means comprising a first group of interconnected parallel spaced conductors, a second group of interconnected parallel spaced conductors, each conductor of said second group being aligned with a corresponding conductor of said first group, and, at least one group of isolated parallel conductors positioned between said first and second group of conductors, each conductor of said one group being aligned with a corresponding conductor of said first group and a corresponding conductor of said second group.

9. A resonator device as set forth in claim 8, wherein said first and second grating reflectors each further comprises a third group of interconnected parallel spaced conductors each conductor of said third group being parallel and interconnected to the conductors of said first and second groups.

10. A resonator device as set forth in claim 8, wherein the conductors of said first group are interconnected along a common end of each conductor of said first group.

11. A resonator device as set forth in claim 10, wherein the conductors of said second group are interconnected along a common end of each conductor of said second group.

12. A resonator device as set forth in claim 8, wherein the conductors of said first group are interconnected along a midpoint of each conductor of said first group.

13. A resonator device as set forth in claim 12, wherein the conductors of the second group are interconnected along a midpoint of each conductor of said second group.

14. A resonator device as set forth in claim 9, wherein the conductors of said one group are positioned on the substrate to face the input and output interdigital transducers.

* * * * *